United States Patent
Chen et al.

(10) Patent No.: US 7,944,731 B2
(45) Date of Patent: May 17, 2011

(54) RESISTIVE SENSE MEMORY ARRAY WITH PARTIAL BLOCK UPDATE CAPABILITY

(75) Inventors: Yiran Chen, Eden Prairie, MN (US); Daniel S. Reed, Maple Plain, MN (US); Yong Lu, Edina, MN (US); Harry Hongyue Liu, Maple Grove, MN (US); Hai Li, Eden Prairie, MN (US)

(73) Assignee: Seagate Technology LLC, Scotts Valey, CA (US)

( * ) Notice: Subject to any disclaimer, the term of this patent is extended or adjusted under 35 U.S.C. 154(b) by 0 days.

(21) Appl. No.: 12/904,653

(22) Filed: Oct. 14, 2010

(65) Prior Publication Data

US 2011/0029714 A1 Feb. 3, 2011

Related U.S. Application Data

(63) Continuation of application No. 12/269,564, filed on Nov. 12, 2008, now Pat. No. 7,830,700.

(51) Int. Cl.
*G11C 11/00* (2006.01)
(52) U.S. Cl. ............. 365/148; 365/230.03; 365/230.04; 365/189.04; 365/235

(58) Field of Classification Search .................. 365/148, 365/230.03, 230.04, 189.04, 235
See application file for complete search history.

(56) References Cited

U.S. PATENT DOCUMENTS

| | | | |
|---|---|---|---|
| 6,567,307 B1 | 5/2003 | Estakhri | |
| 6,763,424 B2 | 7/2004 | Conley | |
| 6,968,421 B2 | 11/2005 | Conley | |
| 7,395,404 B2 | 7/2008 | Gorobets et al. | |
| 7,412,560 B2 | 8/2008 | Smith et al. | |
| 7,830,726 B2 * | 11/2010 | Huang et al. | 365/189.14 |

* cited by examiner

*Primary Examiner* — Thong Q Le
(74) *Attorney, Agent, or Firm* — Feller, Snider, et al.

(57) ABSTRACT

Various embodiments of the present invention are generally directed to a method and apparatus for carrying out a partial block update operation upon a resistive sense memory (RSM) array, such as formed from STRAM or RRAM cells. The RSM array is arranged into multi-cell blocks (sectors), each block having a physical block address (PBA). A first set of user data is written to a selected block at a first PBA. A partial block update operation is performed by writing a second set of user data to a second block at a second PBA, the second set of user data updating a portion of the first set of user data in the first PBA. The first and second blocks are thereafter read to retrieve the second set of user data and a remaining portion of the first set of user data.

20 Claims, 7 Drawing Sheets

RESISTIVE SENSE MEMORY ARRAY WITH PARTIAL BLOCK UPDATE CAPABILITY

RELATED APPLICATIONS

This Patent Application is a continuation of U.S. patent application Ser. No. 12/269,564, filed Nov. 12, 2008, entitled "RESISTIVE SENSE MEMORY ARRAY WITH PARTIAL BLOCK UPDATE CAPABILITY," now U.S. Pat. No. 7,830,700, which is incorporated by reference herein in its entirety.

BACKGROUND

Data storage devices generally operate to store and retrieve data in a fast and efficient manner. Some storage devices utilize a semiconductor array of solid-state memory cells to store individual bits of data. Such memory cells can be volatile or non-volatile. Volatile memory cells retain data stored in memory only so long as operational power continues to be supplied to the device. Non-volatile memory cells retain data stored in memory even in the absence of the application of operational power.

So-called resistive sense memory (RSM) cells can be configured to have different electrical resistances to store different logical states. The resistance of the cells can be subsequently detected during a read operation by applying a read current and sensing a signal in relation to a voltage drop across the cell. Exemplary types of RSM cells include resistive random access memory (RRAM), magnetic random access memory (MRAM), spin-torque transfer random access memory (STTRAM or STRAM), etc.

SUMMARY

Various embodiments of the present invention are generally directed to a method and apparatus for carrying out a partial block update operation upon a resistive sense memory (RSM) array, such as formed from STRAM or RRAM cells.

In accordance with some embodiments, a method comprises arranging a semiconductor array of resistive sense memory (RSM) cells into multi-cell blocks, each block having a physical block address (PBA). A first set of user data is written to a selected block at a first PBA. A partial block update operation is performed by writing a second set of user data to a second block at a second PBA, the second set of user data updating a portion of the first set of user data in the first PBA. The first and second blocks are thereafter read to retrieve the second set of user data and a remaining portion of the first set of user data.

In accordance with other embodiments, an apparatus comprises a non-volatile semiconductor memory array of resistive sense memory (RSM) cells arranged into multi-cell blocks, each block having an associated physical block address (PBA). A controller is configured to direct a writing of a first set of user data to a selected block at a first PBA, to perform a partial block update operation by directing a writing of a second set of user data to a second block at a second PBA wherein the second set of user data updates a portion of the first set of user data in the first PBA, and to direct a reading of the first and second blocks to retrieve the second set of user data and the remaining portion of the first set of user data.

These and various other features and advantages which characterize the various embodiments of the present invention can be understood in view of the following detailed discussion in view of the accompanying drawings.

DETAILED DESCRIPTION

Figure 1:
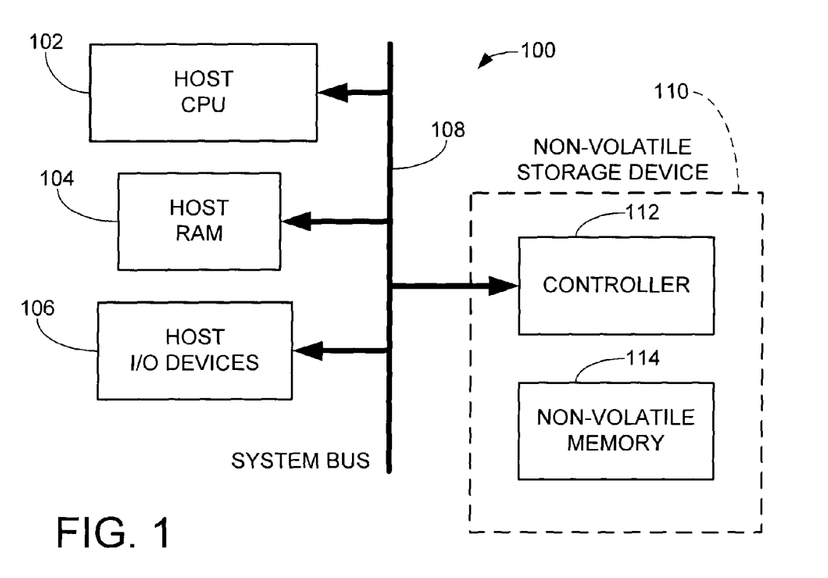
FIG. 1 provides a functional representation of an exemplary host device coupled to a data storage device constructed and operated in accordance with various embodiments of the present invention.

FIG. 1 shows a host device 100 to set forth an exemplary environment in which various embodiments of the present invention can be practiced. The host device 100 is characterized as a processor based device, such as a personal computer, hand-held electronic device, etc.

The host device 100 includes a central processing unit 102, host random access memory (RAM) 104 and a number of host I/O devices 106. The host I/O devices can include a graphical user interface, peripherals utilized by the host device such a printer or a network I/O card, etc. These constituent elements of the host device communicate via a system bus 108.

A non-volatile data storage device 110 is coupled to the host device 100 to provide non-volatile storage of data for use by the host device. The data storage device 110 can be integrated to form a portion of the host device 100, or can be a removeable component that is selectively mated with the host device, such as a removeable drive, memory stick, PCMCIA card, etc.

The data storage device 110 includes a device level controller 112 and a non-volatile memory 114. The controller 112 can take a number of forms, such as a programmable CPU. The memory 114 provides an array memory space and may serve as a main memory for the host device 100.

Figure 2:
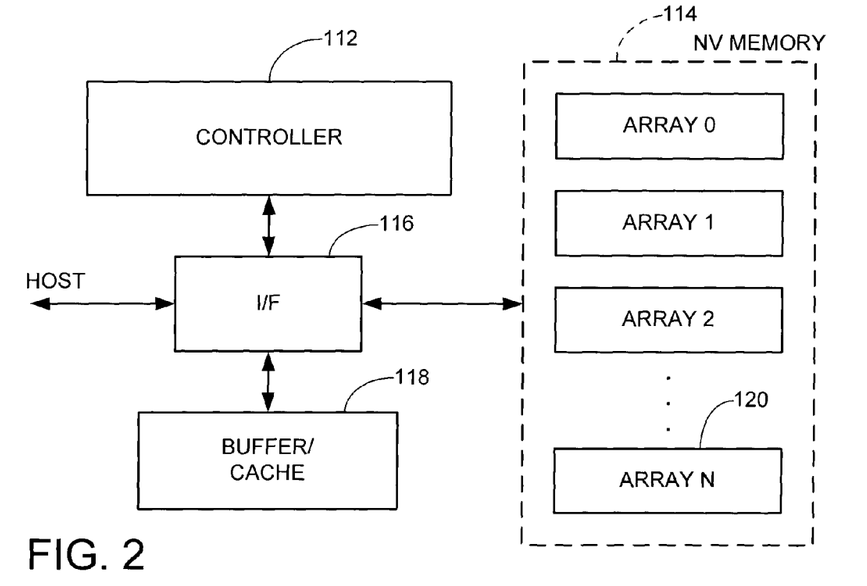
FIG. 2 shows a functional block diagram of the data storage device of FIG. 1.

FIG. 2 provides a functional block representation of the data storage device 110. An interface (I/F) block 116 provides host and controller I/O functions. A buffer/cache block 118 can be used as desired to provide local caching of data during device operation. In some embodiments, the block 118 serves to temporarily store input write data from the host device 100 and readback data pending transfer to the host device, as well as to facilitate serialization/deserialization of the data during a transfer operation. The buffer can be located in any suitable location, including in a portion of the memory 114.

While not limiting, in an embodiment the various circuits depicted in FIG. 2 are arranged as a single chip set formed on one or more semiconductor dies with suitable encapsulation, housing and interconnection features (not separately shown for purposes of clarity). Input power to operate the data storage device 110 is handled by a suitable power management circuit and is supplied via the host device 100 from a suitable source.

Figure 3:
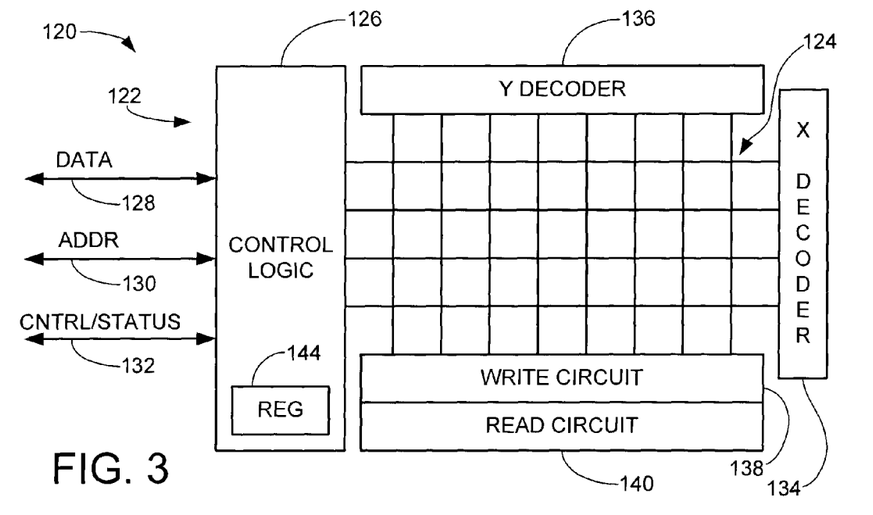
FIG. 3 sets forth circuitry used to read data from and write data to a memory array of the data storage device of FIG. 2.

FIG. 3 illustrates operation of a selected array 120 of FIG. 2. In some embodiments, each array is a separate integrated circuit chip 122. Data are stored in each array in memory cells 124, which are arranged into rows and columns. The memory cells 124 are accessible by various row (word) and column (bit) lines, etc. The actual configurations of the cells and the access lines thereto will depend on the requirements of a given application. The various control lines will include enable lines that selectively enable and disable the respective writing and reading of the value(s) of the individual cells.

Control logic 126 receives and transfers data, addressing information and control/status values along multi-line bus paths 128, 130 and 132, respectively. X and Y decoding circuitry 134, 136 provide appropriate switching and other functions to access the appropriate cells 124. As desired, adjacent arrays can be configured to share a single Y (row) decoder 136 to reduce RC delay effects along an associated word line.

A write circuit 138 represents circuitry elements that operate to carry out write operations to write data to the cells 124, and a read circuit 140 correspondingly operates to obtain readback data from the cells 124. Local buffering of transferred data and other values can be provided via one or more local registers 144. At this point it will be appreciated that the circuitry of FIG. 3 is merely exemplary in nature, and any number of alternative configurations can readily be employed as desired depending on the requirements of a given application.

The memory cells 124 are characterized as so-called resistive sense memory (RSM) cells. As used herein, RSM cells are described as cells configured to have different electrical resistances which are used to store different logical states. The resistance of the cells can be subsequently detected during a read operation by applying a read current and sensing a signal in relation to a voltage drop across the cell. Exemplary types of RSM cells include resistive random access memory (RRAM), magnetic random access memory (MRAM), spin-torque transfer random access memory (STTRAM or STRAM), etc.

Advantages of RSM cells over other types of non-volatile memory cells such as EEPROM and flash include the fact that no floating gate is provided in the cell construction. No erase operation is necessary prior to the writing of new data to an existing set of cells. Rather, RSM cells can be individually accessed and written to any desired logical state (e.g., a "0" or "1") irrespective of the existing state of the RSM cell. Also, write and read power consumption requirements are substantially reduced, significantly faster write and read times can be achieved, and substantially no wear degradation is observed as compared to erasable cells, which have a limited write/erase cycle life.

Figure 4:
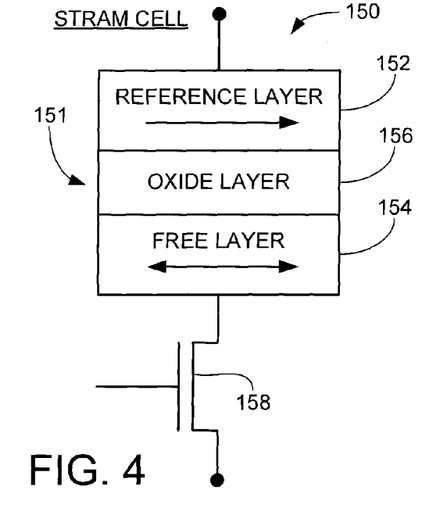
FIG. 4 shows an exemplary construction of a resistive sense memory (RSM) cell characterized as a spin-torque transfer random access memory (STTRAM or STRAM) cell.

FIG. 4 shows an exemplary RSM cell, characterized as an STRAM cell 150. The STRAM cell 150 includes a magnetic tunneling junction (MTJ) 151 with two ferromagnetic layers 152, 154 separated by an oxide barrier layer 156 (such as magnesium oxide, MgO). The resistance of the MTJ 151 is determined in relation to the relative magnetization directions of the ferromagnetic layers 152, 154: when the magnetization is in the same direction (parallel), the MTJ is in the low resistance state ($R_L$); when the magnetization is in opposite directions (anti-parallel), the MTJ is in the high resistance state ($R_H$).

In some embodiments, the magnetization direction of the reference layer 152 is fixed by coupling to a pinned magnetization layer (e.g., a permanent magnet, etc.), and the magnetization direction of the free layer 154 can be changed by passing a driving current polarized by magnetization in the reference layer 152. To read the logic state stored by the MTJ 151, a relatively small current is passed through the MTJ between a source line (SL) and a bit line (BL). Because of the difference between the low and high resistances of the MTJ in the respective logical 0 and 1 states, the voltage at the bit line will be different, and this can be sensed using a sense amplifier or other circuitry. A switching device 158, such as an n-channel metal oxide semiconductor field effect transistor (NMOSFET), provides access to the STRAM cell 150 when a control gate voltage is asserted via a word line (WL).

Figure 5:
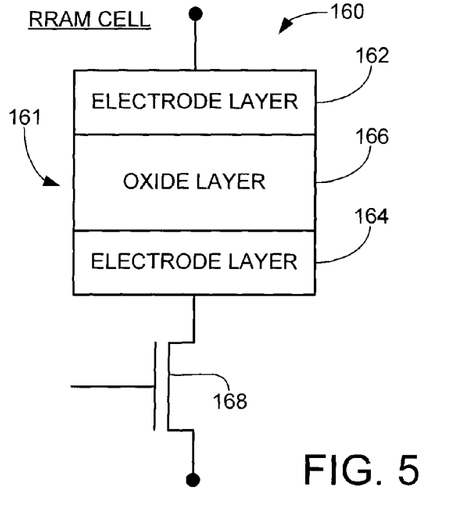
FIG. 5 shows an exemplary construction of a resistive sense memory (RSM) cell characterized as a resistive random access memory (RRAM) cell.

FIG. 5 illustrates an alternative embodiment of the RSM cells 124 in which an RRAM construction is used. An RRAM cell 160 includes a resistive sense element (RSE) 161 with opposing electrode layers 162, 164 and an oxide layer 166. The oxide layer 166 may be configured to have a nominally high voltage (e.g., $R_H$). The resistance of the oxide layer, however, can be lowered (e.g., $R_L$) through application of a relatively high write voltage across the RRAM cell 160. Such voltage generates lower resistance paths (filaments) as components of a selected electrode layer 162, 164 migrate into the oxide layer 166.

The oxide layer 166 can be restored to its original, higher resistance through application of a corresponding voltage of opposite polarity. As with the MTJ 151 of FIG. 4 (which also constitutes a "resistive sense element" for purposes herein), the storage state of the RSE 161 in FIG. 5 can be read by passing a read current from a source line (SL) to a bit line (BL), and sensing the resistance of the cell. As before, a switching device 168 provides selective access to the RRAM cell 160.

Figure 6:
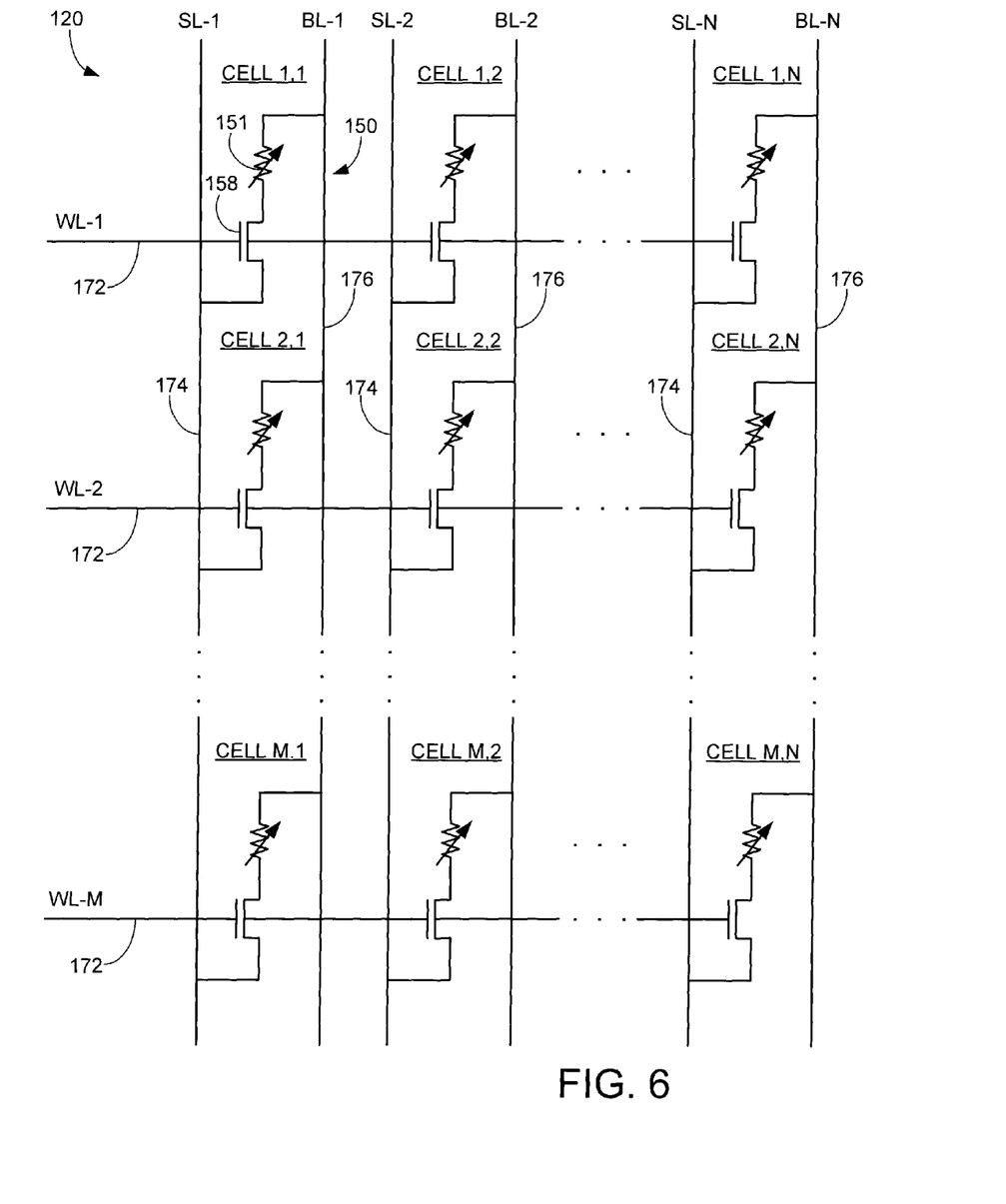
FIG. 6 is a schematic representation of an array of STRAM cells.

FIG. 6 provides a schematic depiction of a number of RSM memory cells of the array 120 of FIG. 2, characterized as STRAM cells 150. In this embodiment, the cells 150 each include an MTJ 151 and a switching device 158. The array 120 is arranged into M rows and N columns, with each cell having a coordinate designation of from cell 1,1 to cell M,N.

Each row of cells 150 is arranged and interconnected along a common word line 172. The word lines 172 are denoted as WL-1, WL-2 . . . WL-N, and each word line connects the gates of the switching devices 168 along each row. Source lines 174 are denoted as SL-1, SL-2 . . . SL-N, and bit lines 176 are denoted as BL-1, BL-2 . . . BL-N. It will be appreciated that other configurations can be readily implemented, so that the configuration of FIG. 6 is merely exemplary and not limiting.

To write a selected cell such as cell 1,1, the WL-1 word line 172 is asserted to place the switching device 158 of cell 1,1 into a conductive state. It is noted that the assertion of the WL-1 word line 172 similarly places all of the switching devices 158 along the associated row into a conductive state. The associated SL-1 source line 174 and BL-1 bit line 176 are coupled to a current driver (not separately shown in FIG. 6) to drive the desired write current through the MTJ 151 in the desired direction. The remaining source and bit lines not connected to cell 1,1 can be appropriately configured (such as in a state of high impedance) to prevent inadvertent writing to these other cells along the selected row.

To read the written state of the cell 1,1, the WL-1 word line 172 is again asserted. The SL-1 source line 174 is placed at an appropriate reference level (such as ground), and a read current is passed along the BL-1 bit line and through the cell. The voltage drop $V_{CELL}$ across the cell is sensed by a sense amplifier or other suitable circuitry (not shown in FIG. 6) and compared to a reference voltage $V_{REF}$. The resistive state (e.g., $R_L$ or $R_H$) and hence, the stored logical state (e.g., logical 0 or 1) is output by the sense amplifier in relation to the respective $V_{CELL}$ and $V_{REF}$ voltage levels.

Two or more bits per cell can alternatively be stored as desired, such as by controllably programming different levels of resistances of the MTJ 151 (e.g., $R_1 < R_2 < R_3 < R_4$). Appropriate reference voltages (e.g., $V_{REF1} < V_{REF2} < V_{REF3}$) can be used to sense these respective resistances. In the foregoing example, the four resistances can be used to store two bits of data (e.g., 00, 01, 10 or 11, respectively). More generally, $2^N$ resistance levels can be used to store N bits per cell. When two or more bits are stored per cell, all of the bits can be used to represent stored data, or one or more bits can be used to provide other types of control data such as a cell flag, etc.

As noted above, an advantage of the use of RSM cells such as the STRAM cells 150 in FIG. 6 is the ability to directly overwrite any existing logical state to a new logical state. By contrast, erasable cells such as flash or EEPROM require erasing to a first state because such cells can only be written in a single direction to a second state. Such erasable cells are erased by applying a relatively large voltage to remove charge from the cell floating gate structures. An uncharged floating gate structure thus constitutes a selected logical level, such as logical 1. The cells are subsequently written by subsequently adding charge to the floating gate structure, which also requires the application of a relatively large voltage to the cell. Thus, to write a multi-bit value such as 0101 to four flash cells, the first and third cells in the sequence are written to logical 0 and the second and fourth cells remain at logical 1.

In accordance with various embodiments, the cells 150 of FIG. 6 are subjected to bit set modes wherein one, some or all of the cells are configured to have the same storage state. This can be advantageous for a variety of reasons, including security and operational efficiencies. Unlike the erasable cells discussed above, the RSM cells can be bit set to any desired value. Indeed, different bit set values can be used at different times, and different bit set values can be written to different groups of cells at the same time. For example, a first bit set operation can be used to provide a first group of the cells 150 with one logical value (e.g., logical 0, logical 10, etc.) while another, subsequent bit set operation can be carried out on a second group of cells 150 to provide a different logical value (e.g., logical 1, logical 01, etc.).

During operation, the controller 112 operates to identify a group of RSM cells in a non-volatile semiconductor memory array to be subjected to a bit set operation. Once the cells are identified, a bit set value is selected from a plurality of bit set values each separately writable to place the cells in a different resistive state. The selected bit set value is thereafter written to at least a portion of the RSM cells in the identified group. It will be noted that each of the plurality of available bit set values can be subsequently overwritten with a different bit set value without requiring an erase operation to remove charge from the cell.

Figure 7:
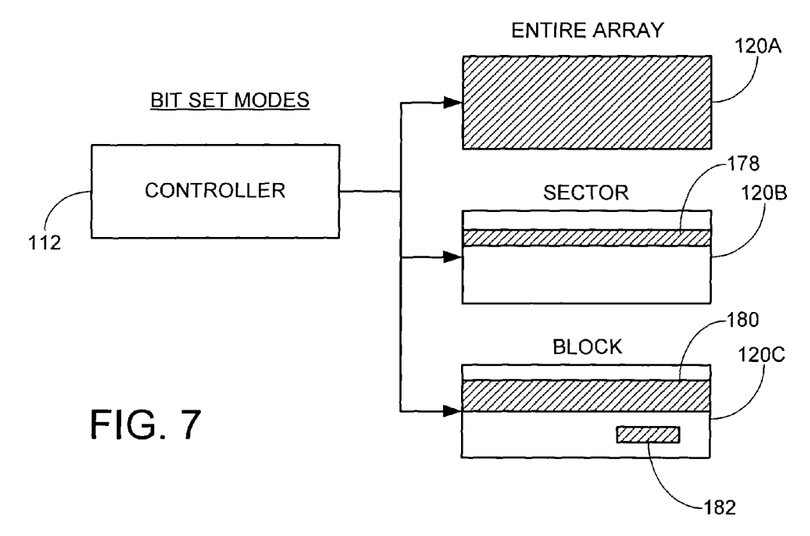
FIG. 7 illustrates different bit set modes of the data storage device.

Various exemplary bit set modes for the data storage device 110 are illustrated in FIG. 7. More specifically, FIG. 7 shows the controller 112 in conjunction with three different arrays 120A, 120B and 120C of the data storage device 110. It will be appreciated that any bit set mode can be applied to any array or portion thereof, as desired.

A global bit set operation is illustrated for the array 120A. The global bit set operation results in the setting of all of the cells 150 in the array to a desired value, as indicated by the cross-hatched section of FIG. 7.

Alternatively, the controller 112 can command a sector level bit set operation, as shown for array 120B. In some embodiments, each array is arranged into a plurality of sectors 178, with each sector 178 constituting an addressable block of data with an associated logical block address (LBA) used by the host device 100 to address the associated data. In FIG. 7, the exemplary sector 178 is shown to constitute all of the cells 150 across an entire row of each array. Other embodiments are readily contemplated, however, such as sectors that take up less than a full row, sectors that span multiple rows (or columns) of cells, etc.

A multi-sector bit set operation is shown at 180 for the array 120C. The multi-sector bit set operation sets the cells 150 in two or more sectors to a desired value. It will be noted that the global bit set operation for the array 120A operates as a bit set operation on all of the sectors in the array. Thus, the sector-level operation at 180 in the array 120C can be used to set less than all of the sectors in the array to a desired bit set value.

In some embodiments, each sector (also referred to herein as a "block") is divided into a number of pages. Such granularity can provide flexibility during device operation. Accordingly, a partial sector bit set operation for a page of data is shown at 182 for the array 120C. Although not shown in FIG. 7, it will also be appreciated that other bit set granularities can be used, including down to the individual cell level.

Figure 8:
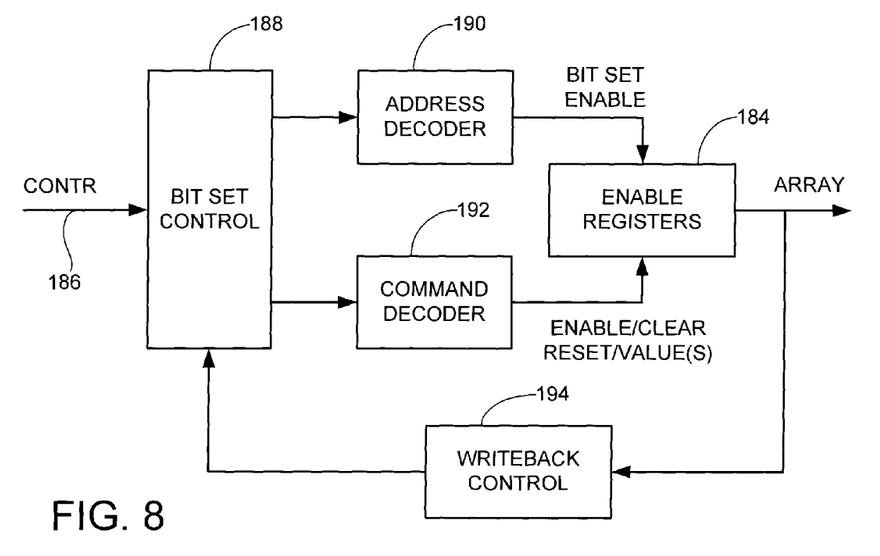
FIG. 8 sets forth a block diagram of circuitry used during the various bit set modes of FIG. 7.

The bit set operations of FIG. 7 are carried out in a manner set forth by FIG. 8. Bit set enable registers 184 operate to select (tag) the associated cells, such as on a global basis, sector basis, page basis, etc. Bit set commands are received from the controller 112 (CONTR) via path 186 by a bit set control block 188, which passes data address and access command data to respective address and command decoders 190, 192. The address decoder 190 decodes the address to identify the corresponding memory cells/pages/sectors/arrays. The command data are decoded by the command decoder 192, which generates various control signals such as ENABLE (to start the bit set operation), CLEAR (to deselect certain addresses from being set), RESET (to conclude the bit set operation), VALUE (to identify the value to be written to each of the bit set cells), etc.

To carry out a bit set operation for a particular sector i in an associated array 120, the controller 112 sends the address of the sector i to the bit set control block 188. The address is decoded and is used in combination with an ENABLE signal from the command decoder 192 to enable the bit set enable registers 184 to initiate the bit set operation.

The bit set operation can be considered to be carried out as a write operation in which the selected value is written to each of the selected cells. Accordingly, the actual bit set operation at the array level (e.g., FIG. 6) can be carried out in relation to the particular configuration and capabilities of the row and column drivers, decoders and read/write circuitry (see e.g., FIG. 3).

In some embodiments, multiple cells are written simultaneously, such as at a byte, block or sector level. In other embodiments, the cells are written individually and sequentially. While not required, in various embodiments a write-read verify operation takes place such that, after the set value is written, the written cell is read to ensure the correct value was stored in the cell.

It is contemplated that in some embodiments a given memory array 120 will have data that should be retained. Such data ("protected data") should not be subjected to overwriting during a bit set operation. Protected data can include overhead or status data such as defect management data, flag bits, programming routines used by the controller 112 or CPU 102 (FIG. 1), etc.

The bit set operation is highly configurable in that, regardless of mode, specific cells that store protected data can be identified and exempted from the bit set operation. In such embodiments, the cells that store protected data remain undisturbed during the bit set operation. By way of illustration, a bit set operation can be commanded for the cells 150 in FIG. 6 along a common word line, such as the WL-2 word line 172. A selected cell 150 along the WL-word line 172, such as cell 2,2, can be deselected from the bit set operation. The bit set operation is applied to the remaining cells along that row. Cell 2,2 is not written during the bit set operation, and thus retains the resistive state it had prior to the bit set operation on the remaining row cells.

In other embodiments, the protected data are initially read back and temporarily stored (cached) in a temporary memory location. A bit set operation is performed that encompasses the particular cells in the array that stored the protected data. The protected data are then written back to the array, overwriting the bit set values placed in the cells during the bit set operation. A writeback control block 194 in FIG. 8 is configured to coordinate such operations.

As noted above, an advantage of the use of resistive sense memory (RSM) cells over conventional erasable cells (such as EEPROM or flash) is that any cell or group of cells with any initial written logical state (e.g., 0, 1, 10) can be immediately overwritten to a new logical state (e.g., 1, 0, 01) state without the need for an intervening erase operation. Thus, in order to update a portion of the data in a particular sector (block) stored in the memory array, the cells associated with the updated portion can be individually accessed and changed to the new desired state (i.e., overwritten with the new data). The remaining cells in the sector can remain undisturbed. One benefit of this approach is that the sector, which may have a host level logical block address (LBA), continues to be located within the array at the original physical block address (PBA). Another benefit of this approach is memory utilization efficiencies are increased.

Nevertheless, various embodiments of the present invention provide a partial sector update capability whereby updated portions of a presently stored sector are written to a different physical sector location. That is, for a given sector with a first LBA and which is stored at a first PBA, updated portions of that sector are written to a second PBA, rather than overwriting the data in the first PBA. This can provide a number of advantages, such as the ability to maintain revision tracking of the data history; using this approach, both the older version of the sector data and the newer version of the sector data are retained and can be retrieved if desired. Indeed, this methodology allows any number of intermediate revisions of the data to be retained and returned, as needed. Retaining the older version of data in the memory also can simplify other system operations, such as in the case where multi-block level ECC schemes are employed.

Figure 9:
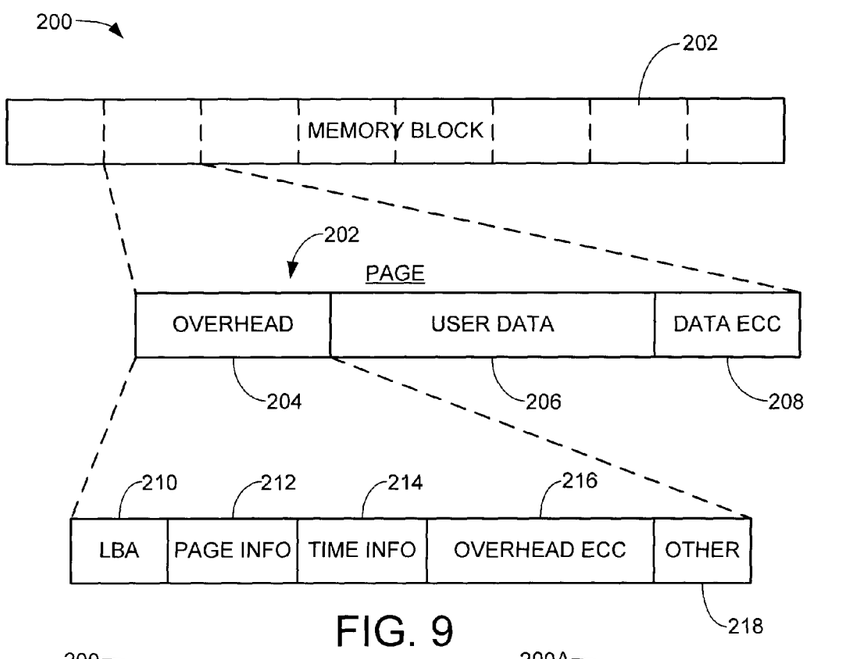
FIG. 9 is an exemplary format for a memory block of the data storage device.

An exemplary memory block (sector) format is shown at 200 in FIG. 9. As noted above, each block (sector) stores a fixed amount of user data, and is divided into a number of portions, or pages 202. In some embodiments, each block stores 512 bytes of user data, and is broken up into eight (8) pages 202. In such case, each page 202 stores 64 bytes of user data (plus overhead). It will be appreciated that other configurations can be readily implemented as desired, including but not limited to different amounts of overall user data per block, different numbers of pages per block, etc. Because of the flexibility provided by RSM cells, such designations need not be fixed, but instead can vary across the array and can be adaptively changed during operation to meet the requirements of a given environment.

Continuing with the exemplary block 200 in FIG. 9, each page 202 includes a leading overhead field 204, a user data field 206, and a data ECC field 208. The user data field 206 stores the aforementioned 64 bytes (or some other amount) of user data for the block 200. The data ECC field 208 stores error correction codes (ECC) that are calculated to enable the detection of up to a selected number of errors and the correction of up to a selected number of errors in the user data. The ECC codes can take any number of desired forms, such as Reed Solomon codes, parity codes, etc.

The leading overhead field 204 includes an LBA field 210, a page field 212, an update field 214, an overhead ECC field 216 and, as desired, an other field 218. The LBA field 210 stores an LBA number (LBN) for the associated contents of the block 200. The page field 212 stores a page number to identify that particular page 202 of the block 200.

The update field 214 stores a revision update indication, such as a time stamp or sequential value, to indicate an update status for the page contents. The overhead ECC field 216 stores ECC values calculated for the overhead field 204. The field 218 accommodates other additional information, such as control flags, spare bytes, etc. associated with the page 202.

Figure 10:
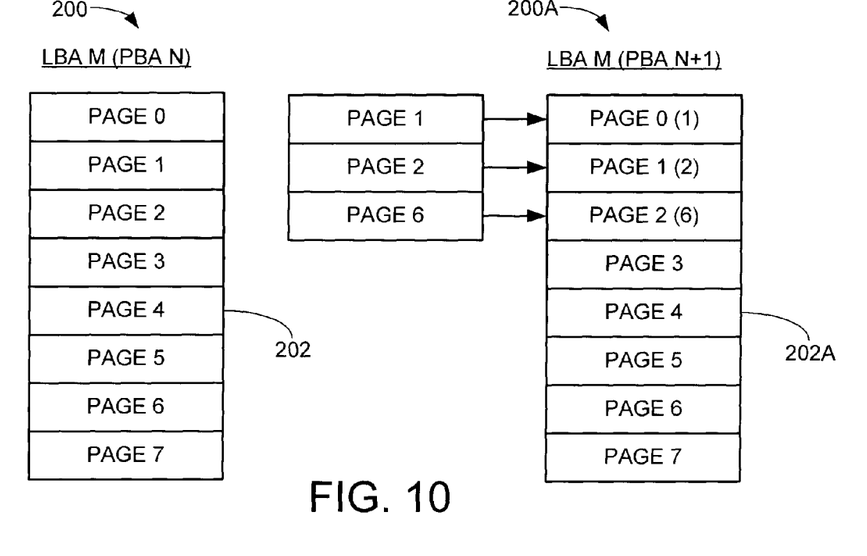
FIG. 10 illustrates a partial block update operation in accordance with some embodiments.

FIG. 10 shows an update operation upon the sector 200 of FIG. 9. The eight pages 202 of the selected sector 200 are identified as Pages 0-7. The sector 200 is assigned a selected logical block address (LBA), in this case LBA M, and is stored at a selected physical block address, in this case PBA N. In this way, the contents of the selected sector 200 can be returned to the host device 100 (FIG. 1) responsive to a request by the host for LBA M, irrespective of the actual PBA at which the selected sector data are stored.

At some point during device operation, a write command is issued by the host device 100 to update only a portion of the sector 200, in this case, the user data associated with pages 1, 2 and 6. In some embodiments, only these pages are sent by the host device 100 for writing. In other embodiments, the entire sector's worth of data are returned to the data storage device 110 for writing, and the storage device 110 determines that only pages 1, 2 and 6 are changed with respect to the originally stored data at PBA N.

Rather than overwriting the existing pages at PBA N with the new data for pages 1, 2 and 6, a second sector 200A (with a physical block address of PBA N+1) is allocated to store the updated data for pages 1, 2 and 6. While the example of FIG. 10 suggests that the sector 200A is immediately adjacent the sector 200, it will be appreciated that this is merely for purposes of illustrating a concrete example; the second sector 200A could be physically located at any convenient location within the memory space, including on a separate array chip.

In some embodiments, the second sector 200A will have been previously subjected to a bit set operation to set the cell values to an initial selected state, such as discussed above in FIGS. 7-8. While the updated pages 1, 2 and 6 can be written to the corresponding pages 1, 2 and 6 in the second sector 200A, in various embodiments these pages are written to the first available pages 0, 1 and 2 in the sector 200A, as shown. Other ordering schemes can also be used.

During this partial sector update operation, each of the updated pages 1, 2 and 6 written to the second sector 200A takes a format as set forth in FIG. 9. That is, the LBA field 210 for each of the updated pages stores the LBA N value of the base sector 200. The page field 212 stores appropriate data to identify which page it replaces in the sector 200; for example, the updated page 1 in sector 200A will be identified as such, etc.

The update field 214 will incorporate suitable data to convey the fact that the updated page represents newer revision data. As noted above, this can constitute a time/date stamp. Since the time/date stamp for the updated page 1 in sector 200A will be later than the time/date stamp for the earlier page 1 in sector 200, the system can readily determine that relative statuses of these respective pages. Other configurations for the update field 214 can be used, such as a sequential value. For example, the originally written data in sector 200 can be written with a base value, such as 1, and each successive update can be incremented (e.g., the updated page 1 in sector 200A would have a value of 2).

In some embodiments, the overhead fields 204 for the original data in the sector 200 can be additionally updated to signify that the data in these pages have been updated with newer version data elsewhere in the array. For example, the page and/or update fields 212, 214 in the original page 1 data can be updated with a data valid flag or other value that signifies that this page has been updated. Such data can further include an identification of the new physical block address, and as desired the associated physical page address, at which the updated data are stored. Alternatively or additionally, a table of reallocation data can be loaded into a suitable memory location, such as but not limited to the buffer/cache 118 of FIG. 1, to signify to the controller 112 where the updated data locations (e.g., PBA N+1 for PBA N) reside within the memory 114.

At such time that the host device 100 issues a request for the data at LBA M, the controller 112 initiates a read back operation upon both sectors 200 and 200A. In some embodiments, the controller 112 will read back the contents of sector 200A first, followed by a read back of the contents of sector 200. With reference again to the example of FIG. 10, once the controller 112 has decoded the overhead bytes of the updated sectors 1, 2 and 6, it can operate to skip the reading of the older versions of these pages as the data in sector 200 are read. Alternatively, as noted above the controller can reconstruct and provide to the host (responsive to a request for the same) both the updated version of the sector data as well as the previous (original) version of the sector data.

In some embodiments, the readback operation can take place in reverse order, starting with the sector 200A at PBA N+1. An advantage of this approach is based on the fact that the latest updated data will be appended to the end of the second sector 200A. Thus, in this approach, the page 6 data in sector 200A at the page 2 "slot" (physical page address 2) will be read first, and so on.

In other embodiments, the controller 112 can begin with reading the original sector 200 in a page sequential order (i.e., from page 0 to page 7). If the overhead field 204 of each page in turn indicates that the data in that page have not been updated, the page data are returned to the buffer/cache 118 (FIG. 2). For example, since in FIG. 10 the first page 0 has not been updated, this page of data would be initially returned. On the other hand, if the overhead field 204 signifies that a later version (or versions) of data exist, the controller 112 can skip to the new location and retrieve the later version of data. In this approach, as shown in FIG. 10 the controller 112 would detect from the original page 1 in sector 200 that the replacement page 1 is in sector 200A, and would accordingly direct the reading of that sector. The controller would then return to sector 200 to evaluate page 2, and so on. An advantage of this latter approach is that the latest version of the sector data are loaded to the buffer/cache 118 (or forwarded to the host directly) in the correct page-sequence order (i.e., from page 0 to page 7).

Figure 11:
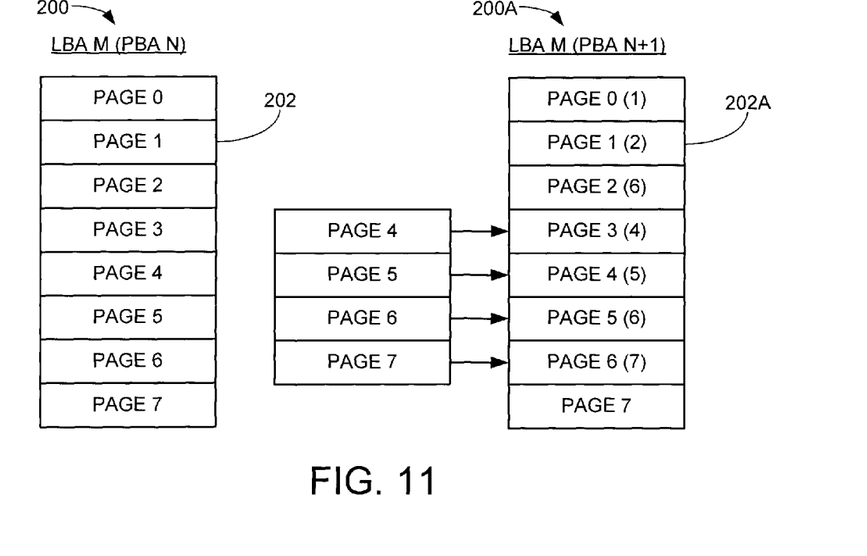
FIG. 11 illustrates a second partial block update operation upon the configuration of FIG. 10.

FIG. 11 represents a subsequent update to the data of the sector 200. More specifically, it is contemplated that after the update operation of FIG. 10, updated pages 4-7 are supplied by the host device 100 for storage. In accordance with some embodiments, these updated pages 4-7 are written to the next available locations in the sector 200A at PBA N+1. It is noted that this provides three copies of page 6: the original page 6 data of sector 200 at PBA N; the first revised version of page 6 at the page 2 "slot" in PBA N+1; and the second revised version of page 6 at the page 5 slot in PBA N+1.

As before, the overhead fields of the respective fields are updated to signify the current status. In some embodiments, the second version of page 6 at the page 2 slot in PBA N+1 will signify that an updated version exists elsewhere (e.g., slot 5). Reading of the data for sector 200 can thus be variously carried out as set forth above.

Figure 12:
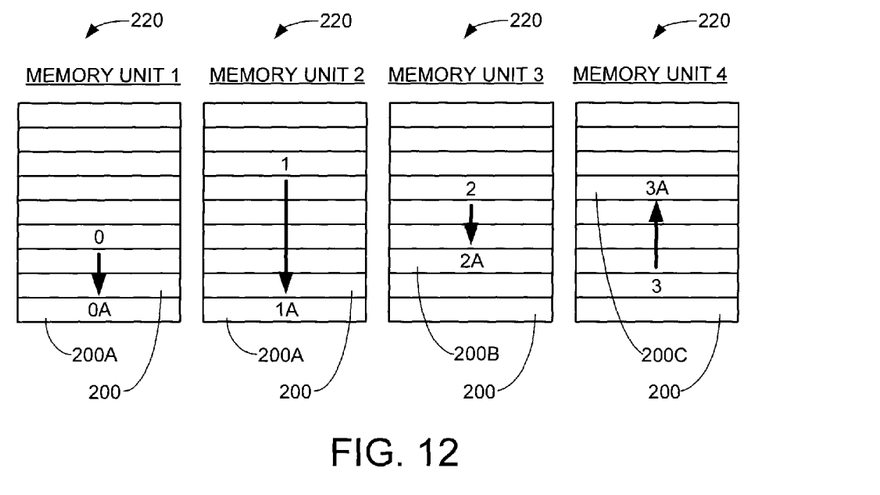
FIG. 12 shows an arrangement of blocks across a number of memory units, wherein one or more blocks in each memory unit are used to accommodate updated portions of blocks.

The data storage device 110 can arrange the memory 114 (FIG. 2) into multiple memory units 220, such as units 0-3 in FIG. 12. Each memory unit 220 can correspond to one of the arrays 120 discussed above, or can encompass less or more than an array 120. Each memory unit 220 constitutes a relatively large number of blocks 200. The controller 112 can write pages 202 (FIGS. 9-11) into the memory blocks 200 in some or all of the memory units on a selective basis, such as shown for the memory blocks 0-3.

Figure 13:
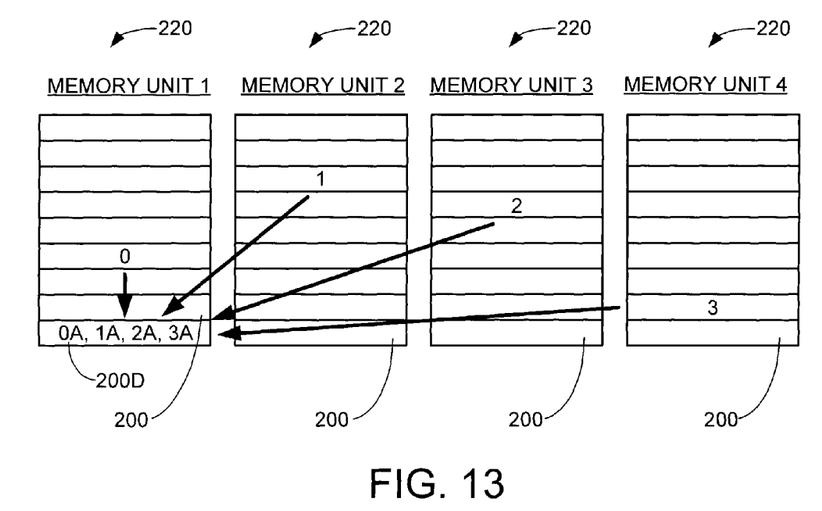
FIG. 13 shows an alternative arrangement of the memory units of FIG. 12 wherein one or more blocks in a selected memory unit are used to accommodate updated portions of blocks from multiple memory units.

In such case, a single update block 200A (or a small number of such dedicated blocks) can be previously designated in each memory unit 220 for the updated pages 202, such as shown for the sectors 200A in memory units 0 and 1. Alternatively, the updated sectors can be allocated as needed from any available sector, such as shown for second sectors 200B and 200C in memory units 2 and 3. Alternatively, as denoted by FIG. 13, updated pages from multiple units 220 can be written to a group of designated blocks (collectively, 200D) such as located in the memory unit 0.

As noted above, a bit set operation such as discussed in FIGS. 7-8 can be carried out to the allocated second sectors 202A as a part of, or prior to, the partial sector (block) update operations of FIGS. 10-13. The bit set value can be selected to be any suitable value, including a value that identifies the second sector 202A as constituting an update sector. For example, the update sectors 202A can be bit set to a different initial value than other sectors in the respective arrays. This can be advantageous, for example, in verifying that the sector being accessed during a write or read operation is in fact an update sector.

Once updated data have been written to a selected sector, such as the sector 200 in FIGS. 10 and 11, the older versions of the data can be marked for a bit set operation. For example, with reference again to FIG. 10, once the page 1 data in sector 200 have been updated with the newer page 1 data in sector 200A, the page 1 data in sector 200 can be bit set to an appropriate value. In such case the old page 1 in sector 200 is now available to receive updated data associated with the LBA M, or even with some other LBA (such as LBA M+1). Indeed, by reusing pages that have been updated, two sectors can be allocated for a given LBA and used to store an unlimited number of updates for the LBA, by simply switching between the two respective sectors and overwriting previous versions of the pages.

Figure 14:
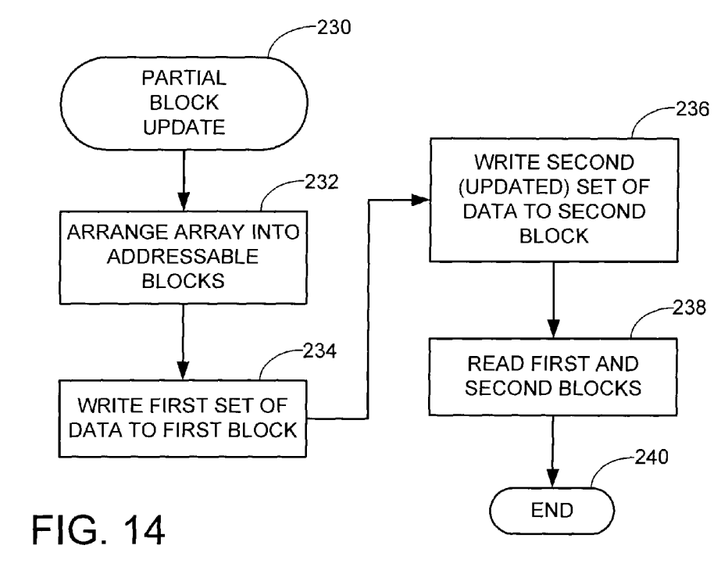
FIG. 14 shows a flow chart for a PARTIAL BLOCK UPDATE routine.

FIG. 14 provides a flow chart for a PARTIAL BLOCK UPDATE routine 230, illustrative of various embodiments of the present invention. At step 232, a semiconductor array of resistive sense memory (RSM) cells is arranged into multi-cell blocks, each block having a physical block address (PBA). At step 234, a first set of user data is written to a selected block at a first PBA, such as for the sector 200 in FIGS. 9-10.

A partial block update is performed at step 236 by writing a second set of user data to a second block at a second PBA, such as the sector 200A in FIGS. 2-10. The second set of user data updates a portion of the first set of user data in the first PBA. If the sector 200 incorporates N pages, the update operation updates some number of pages less than N, such as N-M pages where M is less than M. In the example of FIG. 9, N=8, N-M=3, and M=5.

Continuing with FIG. 14, at step 238 the first and second blocks are read to retrieve the second set of user data and a remaining portion of the first set of user data. Using the foregoing example from FIG. 9, this can mean that the M=5 original pages from the first sector 200 and the N-M=3 updated pages from the second sector 202, are returned. The routine of FIG. 14 is then shown to end at step 240, but it will be appreciated that additional steps can be carried out as discussed above, including a bit set operation upon the second sector, additional update operations, etc.

In some embodiments, upon a receipt of write data from the host device 100, the controller 112 will determine whether there is sufficient data to fill at least one entire memory block. If so, the system will allocate one or more such blocks and write the data thereto. If the new data corresponds to an existing LBA in the memory, the block storing the previous version(s) of the data will be marked for a bit set operation (and deallocation to the memory pool).

On the other hand, if the received data constitute less than a full block worth of data, the foregoing partial block update operation will be carried out and the received partial block data will be written to a new block. As desired, the older version data will be marked for a bit set operation. In this way, efficient access operations can be carried out to store and retrieve user data, will at the same time providing efficient memory utilization.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising:
arranging a semiconductor array of resistive sense memory (RSM) cells into multi-cell blocks, each block having a physical block address (PBA);
identifying a block to undergo a bit set operation, the block comprising at least one protected data cell;
writing a first set of user data to the block at a first PBA during the bit set operation;
performing a partial block update operation by writing a second set of user data to a second block at a second PBA, the second set of user data updating a portion of the first set of user data in the first PBA while exempting the protected data cell.

2. The method of claim 1, further comprising reading the first and second blocks to retrieve the second set of user data, the protected data, and a remaining portion of the first set of user data.

3. The method of claim 1, wherein the protected data cell is not overwritten during the bit set operation and partial block update operation.

4. The method of claim 1, wherein the protected data cell includes at least user data and overhead data status data.

5. The method of claim 4, wherein the overhead data has programming routines used by a controller.

6. The method of claim 1, wherein the protected data cell is initially read back and temporarily cached while the bit set operation is performed.

7. The method of claim 6, wherein the protected data cell is written back to the array by overwriting at least one bit set value programmed during the bit set operation.

8. The method of claim 6, wherein a writeback control circuit coordinates the caching of the protected data cell.

9. The method of claim 1, further comprising a step of performing a second partial block update operation by writing a third set of user data to the second block at the second PBA wherein the third set of user data updates a portion of the second set of user data, and wherein the reading step further comprises retrieving the third set of user data from the second block.

10. The method of claim 1, wherein the RSM cells are characterized as spin-torque transfer random access memory (STRAM) cells.

11. The method of claim 1, wherein the RSM cells are characterized as resistive random access memory (RRAM) cells.

12. A memory device comprising:
a non-volatile semiconductor memory array of resistive sense memory (RSM) cells storing two or more bits per cell and arranged into multi-cell blocks, each block having an associated physical block address (PBA) and logical block address (LBA); and
a controller configured to direct a writing of a first set of user data to a selected block at a first PBA and LBA, to perform a partial block update operation by directing a writing of a second set of user data to a second block at a second PBA while maintaining the first LBA wherein the second set of user data updates a portion of the first set of user data in the first PBA, and to direct a reading of the first and second blocks to retrieve the second set of user data and the remaining portion of the first set of user data.

13. The memory device of claim 12, further comprising performing a bit set operation upon the second block prior to the performing step, wherein the bit set operation comprises selecting a bit set value from a plurality of bit set values each separately writable to said cells to place said cells in a selected resistive state, and writing the selected bit set value to each of the cells in the second block.

14. The memory device of claim 13, further comprising a step of using a first bit set value for the second block, and performing the bit set operation upon a third block using a second bit set value different than the first bit set value.

15. The memory device of claim 12, wherein the first and second blocks are each configured to store a common amount of user data.

16. The memory device of claim 12, wherein each of the first and second blocks are divided into number of pages N, wherein the first set of user data of the writing step constitutes N pages of user data, wherein the second set of user data of the performing step constitutes N-M page of user data where M is less than N, and wherein the reading step comprises returning said N-M pages of user data from the second block and returning M pages of user data from the first block.

17. The memory device of claim 12, wherein array employs a multi-block level error correction code (ECC).

18. The memory device of claim 12, wherein the first and second blocks are divided into a plurality of pages, each page comprising a user data field to store user data and an overhead field to store an update status for the associated user data in the user data field.

19. The memory device of claim 12, wherein the first and second user data each have associated overhead data stored for the LBA.

20. The memory device of claim 19, wherein the overhead data has an update field that stores revision information to indicate the most recent version of the user data.

\* \* \* \* \*